United States Patent
Goenka et al.

(10) Patent No.: US 7,026,582 B2
(45) Date of Patent: Apr. 11, 2006

(54) VECTOR TRANSIENT REFLOW OF LEAD FREE SOLDER FOR CONTROLLING SUBSTRATE WARPAGE

(75) Inventors: Lakhi N. Goenka, Ann Arbor, MI (US); Peter J. Sinkunas, Canton, MI (US); Larry N. Schmidt, Glenside, PA (US); Sherwin T. Moss, Philadelphia, PA (US)

(73) Assignee: Visteon Global Technologies, Inc., Dearborn, MI (US)

( * ) Notice: Subject to any disclaimer, the term of this patent is extended or adjusted under 35 U.S.C. 154(b) by 24 days.

(21) Appl. No.: 10/431,258

(22) Filed: May 7, 2003

(65) Prior Publication Data

US 2005/0001019 A1    Jan. 6, 2005

(51) Int. Cl.
*F27D 11/00* (2006.01)
*F27B 9/06* (2006.01)
*B23K 31/02* (2006.01)

(52) U.S. Cl. ............ 219/400; 219/388; 219/390; 219/391; 219/412; 228/233.2

(58) Field of Classification Search ............ 219/388, 219/390, 400; 228/233.2
See application file for complete search history.

(56) References Cited

U.S. PATENT DOCUMENTS

| | | | |
|---|---|---|---|
| 3,710,069 A | 1/1973 | Papadopoulos et al. | |
| 4,295,596 A | 10/1981 | Doten et al. | |
| 4,321,031 A | 3/1982 | Woodgate | |
| 4,408,400 A | 10/1983 | Colapinto | |
| 4,725,716 A | 2/1988 | Entwistle et al. | |
| 4,775,776 A | * | 10/1988 | Rahn et al. ............ 219/388 |
| 4,805,827 A | 2/1989 | Coffman et al. | |
| 4,833,301 A | * | 5/1989 | Furtek ............ 219/388 |
| 4,951,401 A | * | 8/1990 | Suzuki et al. ............ 34/77 |
| 4,979,290 A | 12/1990 | Chiba | |
| 5,039,841 A | * | 8/1991 | Kato et al. ............ 219/388 |
| 5,163,599 A | 11/1992 | Mishina et al. | |
| 5,196,667 A | 3/1993 | Gammelin | |
| 5,203,487 A | 4/1993 | Mishina et al. | |
| 5,358,167 A | 10/1994 | Tachibana et al. | |
| 5,373,893 A | 12/1994 | Eisenmann et al. | |
| 5,431,332 A | 7/1995 | Kirby et al. | |
| 5,467,912 A | 11/1995 | Mishina et al. | |
| 5,495,089 A | 2/1996 | Freedman et al. | |
| 5,622,304 A | 4/1997 | Sato | |
| 5,735,450 A | 4/1998 | Heim et al. | |
| 5,785,233 A | 7/1998 | Nutter et al. | |
| 5,854,092 A | 12/1998 | Root et al. | |
| 5,860,583 A | 1/1999 | Liebman et al. | |
| 5,898,992 A | 5/1999 | Annable | |

(Continued)

FOREIGN PATENT DOCUMENTS

DE    101 45 883 C1    4/2003

(Continued)

OTHER PUBLICATIONS

JP 2002-178140—English Abstract.

(Continued)

*Primary Examiner*—Lynne R. Edmondson
(74) *Attorney, Agent, or Firm*—Brinks Hofer Gilson & Lione

(57) ABSTRACT

A system and method for reflowing lead-free solder to interconnect a plurality of electronic components to a substrate is disclosed. The system includes an oven for preheating the substrate and the plurality of electronic components disposed thereon, and a supplemental heat source disposed in the oven for providing additional heat energy to reflow the solder.

10 Claims, 8 Drawing Sheets

U.S. PATENT DOCUMENTS

| | | |
|---|---|---|
| 5,971,249 A | 10/1999 | Berkin |
| 5,996,222 A | 12/1999 | Shangguan et al. |
| 6,003,757 A | 12/1999 | Beaumont et al. |
| 6,005,224 A | 12/1999 | Wesseling et al. |
| 6,145,734 A | 11/2000 | Taniguchi et al. |
| 6,168,064 B1 | 1/2001 | Berkin |
| 6,180,215 B1 | 1/2001 | Sprietsma et al. |
| 6,186,392 B1 | 2/2001 | Ball |
| 6,201,222 B1 * | 3/2001 | Baker et al. ................ 219/497 |
| 6,206,265 B1 | 3/2001 | Yamaoka |
| 6,222,740 B1 | 4/2001 | Bovensiepen et al. |
| 6,247,630 B1 | 6/2001 | Terry et al. |
| 6,267,288 B1 | 7/2001 | Chung |
| 6,283,358 B1 | 9/2001 | Ball |
| 6,320,691 B1 | 11/2001 | Ouchi et al. |
| 6,343,001 B1 | 1/2002 | Japp et al. |
| 6,347,734 B1 | 2/2002 | Downes |
| 6,642,485 B1 * | 11/2003 | Goenka et al. ............. 219/400 |
| 6,794,616 B1 * | 9/2004 | Goenka ...................... 219/400 |
| 2001/0055740 A1 | 12/2001 | Bloom et al. |
| 2003/0005581 A1 * | 1/2003 | Watanabe et al. ............. 29/739 |
| 2004/0002227 A1 * | 1/2004 | Shiozawa ................... 438/795 |
| 2004/0050915 A1 * | 3/2004 | Goenka et al. ......... 228/248.1 |
| 2005/0218138 A1 * | 10/2005 | Struble et al. .............. 219/388 |

FOREIGN PATENT DOCUMENTS

| | | |
|---|---|---|
| DE | 102 56 250 A1 | 8/2003 |
| GB | 2 372 228 | 8/2002 |
| GB | 2 382 542 | 6/2003 |
| JP | 1-225195 | 9/1989 |
| JP | 05-161961 A * | 6/1993 |
| JP | 8-8527 | 1/1996 |
| JP | 09-283916 A * | 10/1997 |
| JP | 2001-127422 A * | 5/2001 |
| JP | 2002-158434 | 5/2002 |
| JP | 2002-178140 | 6/2002 |
| WO | WO 02/28583 | 4/2002 |
| WO | WO 02/28584 A1 | 4/2002 |

OTHER PUBLICATIONS

JP 2002-158434—English Abstract.
1-225195—English Abstract.
8-8527—English Abstract.
English Abstract of German Patent No. 101 45 883 C1.
English Abstract of German Patent No. 102 56 250 A1.

* cited by examiner

VECTOR TRANSIENT REFLOW OF LEAD FREE SOLDER FOR CONTROLLING SUBSTRATE WARPAGE

TECHNICAL FIELD

The present invention relates to a system and method for reflowing lead-free solder to electrically connect electronic components to a substrate.

BACKGROUND OF THE INVENTION

It is well known in the art to mount electronic components to rigid and printed circuit boards. Typically, solder paste is applied to conductor pad regions on the rigid or substrate. Components are then placed with their terminals contacting the solder paste in the pad regions. The substrate is then exposed to relatively high temperatures to activate the solder paste which melts and then solidifies to bond and electrically connect the components onto the substrate.

A technique for mounting components onto flexible polyester substrates with low softening temperatures is taught by Annable in U.S. Pat. No. 5,898,992. The flexible substrate is fixed to a carrier support member. A cover is placed over the substrate. The cover has openings corresponding to component locations and with the carrier forms a carrier assembly. Solder paste is applied to the conductor regions of the substrate having component pads. Electronic components are then placed on the substrate with their terminals in contact with the solder paste. The carrier assembly is then pre-heated in a reflow oven to a temperature below the melting point of the solder paste. The assembly is then subjected to a rapid rise in temperature utilizing a supplemental heat source such as a heated gas jet. The cover shields the substrate from the high reflow temperatures and minimizes distortion of the flexible substrate during reflow.

While the prior art teaching achieves its intended purpose significant improvements are needed. For example, it would be desirable to eliminate the need for a special cover for shielding specific areas of the substrate from the heat generated by the gas jet. Additionally, a process for reflowing lead-free solder disposed between a substrate and a plurality of electronic components thereon is not addressed by the prior art and is therefore needed.

BRIEF SUMMARY OF THE INVENTION

In an embodiment of the present invention a system for reflowing solder to interconnect a plurality of electronic components to a substrate is provided. The system includes an oven for preheating the substrate and the plurality of electronic components disposed thereon, and a supplemental heat source positioned within the oven for providing additional heat energy to reflow the solder.

In another embodiment of the present invention the supplemental heat source is a nozzle positioned within the oven, wherein the nozzle has a plurality of vanes for directing hot gas transversely across the substrate.

Preferably, the circuit conductors on the substrate are copper. Selected regions of the conductors referred to as component pads are provided with a surface finish such as tin or immersion silver to enhance the ease of soldering to the pads. The spaces between the conductor regions of the substrate may be filled with electrically isolated regions of copper having the same thickness as the conductor regions. These copper areas further shield the substrate during reflow by selectively absorbing heat during the reflow process.

The substrate may be comprised of more than two layers of circuit conductors, commonly referred to as multi-layer circuits. For these circuits, two or more layers of the substrate are used and bonded together with a suitable adhesive to form four or more conductor layers.

In still another embodiment of the present invention a supplemental heat source used to activate the solder paste may be supplied by one or more jets of hot gas which are directed toward the exposed areas of the substrate. Suitably, the jet of hot gas extends transversely over the width of the substrate.

In yet another embodiment of the present invention, a method for reflowing solder to interconnect a plurality of electronic components to a substrate is provided. The method includes inserting the substrate into an oven, preheating the substrate and the plurality of electronic components disposed thereon, providing additional heat energy to reflow the solder using a supplemental heat source positioned within the oven.

DETAILED DESCRIPTION OF THE INVENTION

Figure 1:
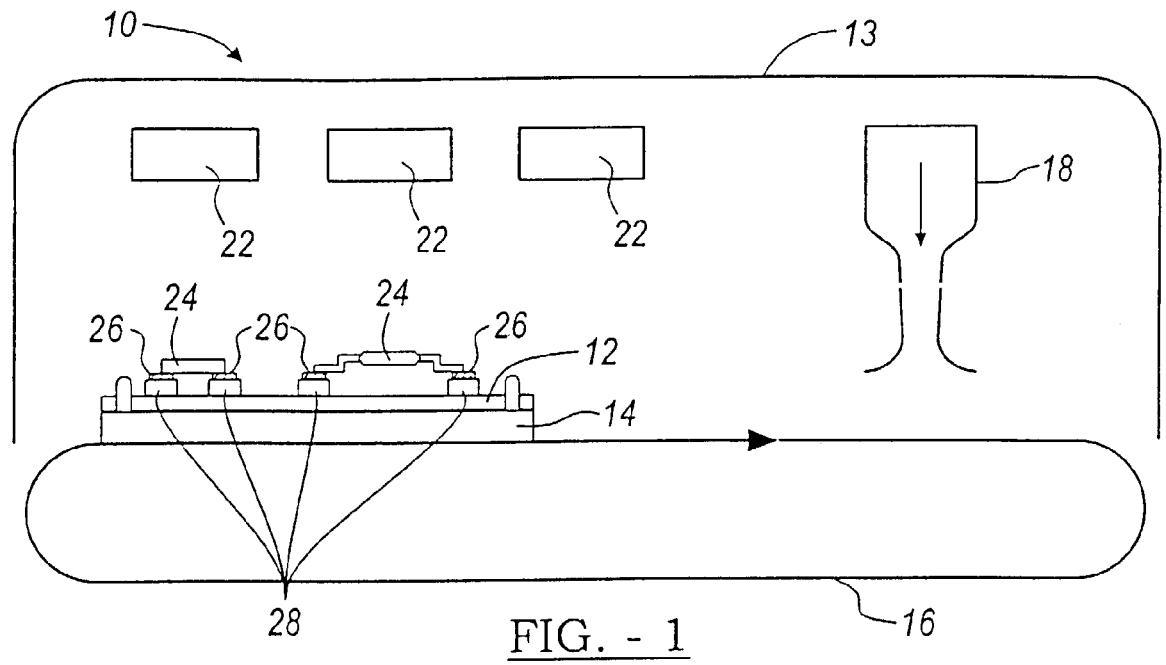
FIG. 1 is a schematic representation of an apparatus for reflowing solder to electrically connect electronic components to a substrate mounted on a pallet, in accordance with the present invention.

A system 10 for reflowing solder to electrically interconnect electronic components to a flexible, semi-flexible or rigid substrate 12 is illustrated in FIG. 1, in accordance with the present invention. Further, system 10 includes a pallet 20 that provides a means to mount circuit components on substrate 12 without degrading the material properties of the substrate. System 10 additionally includes a reflow oven 13, a conveyor system 16, a gas nozzle 18 and a pallet 20. The reflow oven has a plurality of heaters 22 to pre-heat the substrate 12 to a desired temperature. Conveyor system 16 is configured in a conventional manner to cooperatively receive pallets 14 for movement through the reflow oven 13.

Pallet 14 in an embodiment of the present invention is, preferably, a phase-transition pallet 14 for reflowing solder paste to interconnect electronic components 24 to substrates 12. Phase-transition pallet 14 is configured to support substrate 12 and cooperates with conveyor system 16 to transport substrate 12 through oven 13. Oven 13's heaters 22 pre-heat substrate 12, and hot gas nozzle 18 provides supplemental heating. Solder paste 26 is printed on conductor pads 28 disposed on substrate 12 on which components 24 are placed.

Figure 2B:
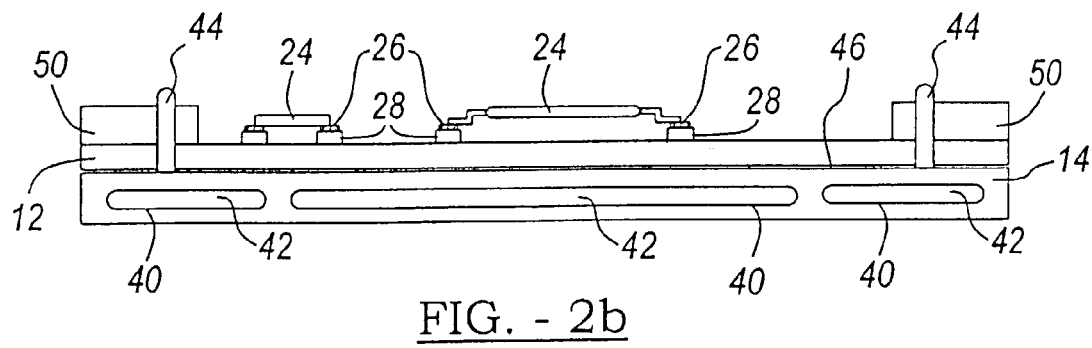
FIGS. 2a–2b is a cross-sectional and plan view of a preferred embodiment of a phase-transition pallet, in accordance with the present invention.
Figure 2A:
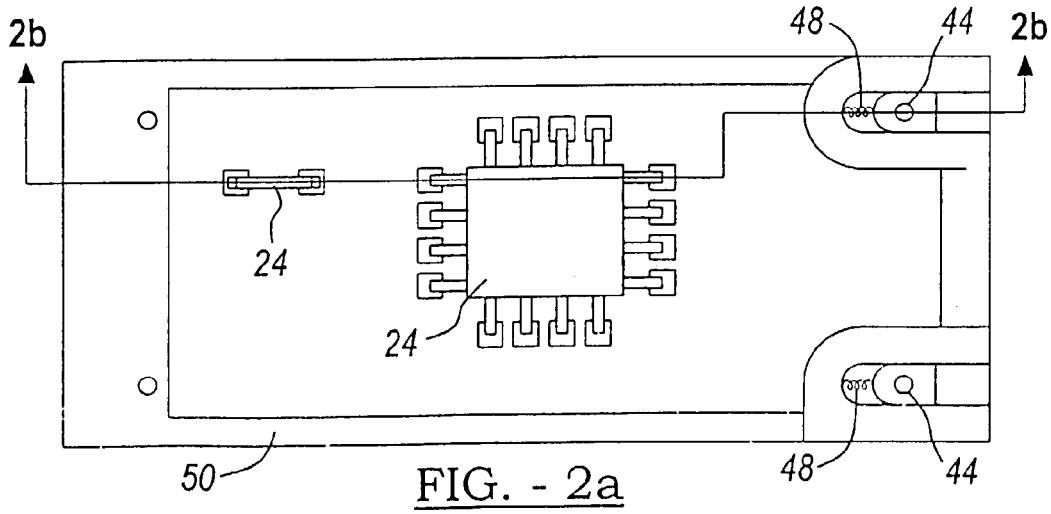
Figure 3A:
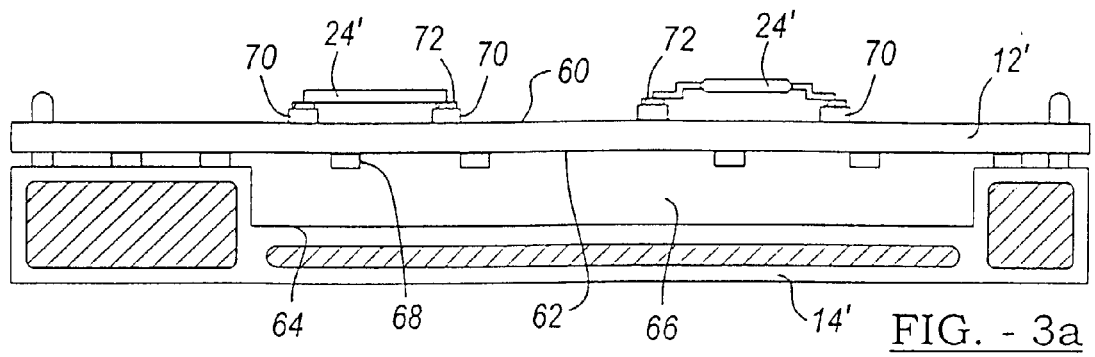
FIGS. 3a–3d are cross-sectional views of the phase-transition pallet having a substrate on which electronic components are mounted on both exposed sides of the substrate, in accordance with the present invention.
Figure 3B:
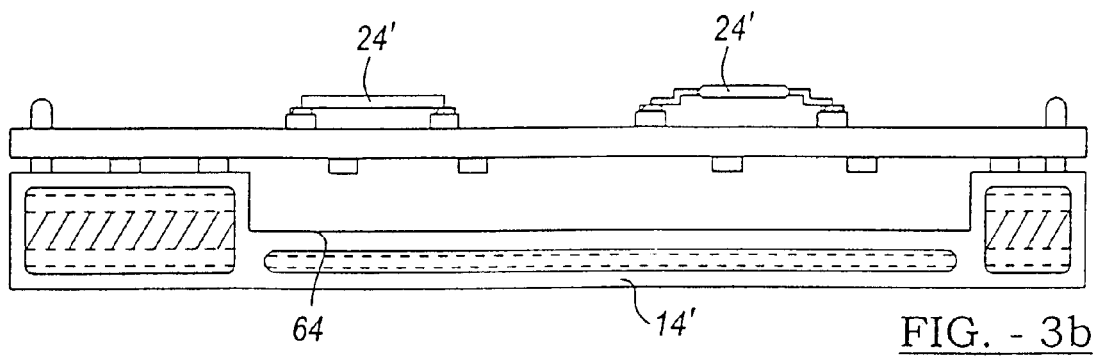
Figure 3C:
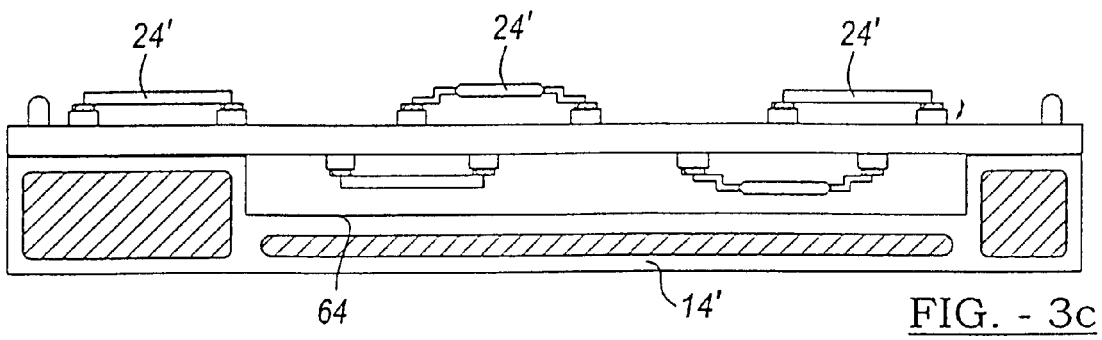
Figure 3D:
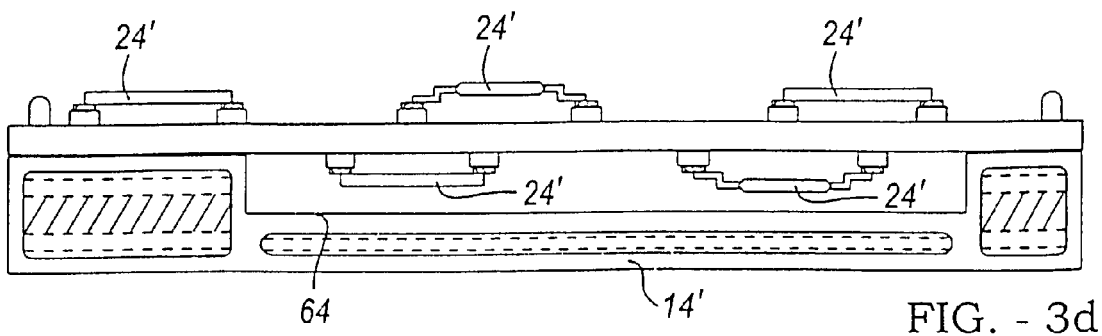

Referring now to FIG. 2a–2b, an elevation and cross-sectional views of phase-transition pallet 14 are illustrated, in accordance with the present invention. As shown pallet 14 includes at least one internal cavity 40 having therein a phase-change material 42. Support pins 44 are provided on pallet 14 to hold substrate 12 flat or planar on a pallet surface 46. Pins 44 may be tensioned or loaded by springs 48 to provide a tensioning force on substrate 12. In an embodiment of the present invention, a picture frame 50 may be used to secure substrate 12 against pallet surface 46. Picture frame 50, as illustrated attaches to and secures the periphery of substrate 12 to hold the edges of substrate 12 against surface 46 of the pallet.

In another embodiment of the present invention, a phase-transition pallet 14' configured to accommodate a double-sided substrate 12 which electronic components 24' are populated on both sides 60, 62 of substrate 12', is illustrated. In several of the cross-sectional views, as shown in FIGS. 3a–3d, pallet 14' has at least one open cavity 64 to accommodate electronic components 24' that have been mounted on the first exposed surface 60 of substrate 12'. Open cavity 64 may be filled with a suitable foam 66, if necessary, to provide additional support for substrate 12'.

In a preferred embodiment of the present invention, substrate 12' is a polyester film having a thickness of 0.003 to 0.010 inches. Copper conductors 68 and solder pads 70 may be formed on both sides 60, 62 of the polyester substrate, as is well known in the art. A suitable solder mask (not shown) is applied over copper conductors 68 so that only the pad 70 areas on which solder paste 72 is to be printed are exposed. These pads 70 may have a suitable surface finish such as an organic surface finish to protect the pad surfaces from oxide formation. Other surface finishes such as immersion silver or electroplated tin may be used to enhance the solderability of components 24' to the pads.

Solder pastes 72 that have compositions containing lead, as well as solder pastes having lead-free compositions may be used. The solder pastes containing lead generally have a lower melting temperature of about 183° to 200° C., while lead-free solder compositions have melting temperatures of about 220° to 245° C.

In operation, as pallet 14 or 14' having substrate 12 or 12' affixed thereon is transported through the pre-heat zones in oven, the solder paste 72 is activated and gradually heated to just below its melting temperature. During this process, the phase-transition material 42 begins to absorb heat from the oven 13 as well as from the substrate 12 or 12', and thereby lowers the temperature of the substrate. The phase transition material 42 is selected having a melting point that is lower than the melting point of the solder paste 72. As the phase-transition material 42 begins to melt, the material begins to absorb an amount of heat or energy equal to the latent heat of the material. Consequently, the temperature of phase-change material 42 is held constant until the material is fully melted. Thus, the present invention significantly enhances the heat absorption properties of the pallet 14 or 14' and maintains a lowered substrate 12 or 12' temperature during reflow of the solder paste 72.

In a preferred embodiment of the present invention, phase-transition material 42 exhibits a melting temperature lower than that of solder 72, and may be comprised of conductive metals such as gallium, gallium alloys, or alloys of tin and lead. Other suitable phase transition materials include chloro-fluoro carbons and their compounds.

The supplemental heat created from gas nozzle 18 is utilized to provide a focused and concentrated heat source. Gas nozzle 18 provides heat to the exposed substrate surface for a short duration. The solder paste 26, conductor pads 28, and copper regions of substrate preferable absorb heat because of their high thermal diffusivity, while substrate 12 or 12' is maintained at a lower temperature by the pallet 14 or 14', which is held at a lower temperature by the phase-transition material 42. In this manner, softening and damage to substrate 12 or 12' during the reflow process is prevented.

After the exposed region of the substrate passes below gas nozzle 18, the temperature of the exposed electronic component 24 and substrate 12 or 12' rapidly falls so that the activated solder cools and solidifies. A reliable electrical connection between the conductors or pads 20 and components 24 or 24' is thus formed. During this process, the phase-transition material 42 also solidifies, so that pallet 14 or 14' is ready for reuse.

Figure 4A:
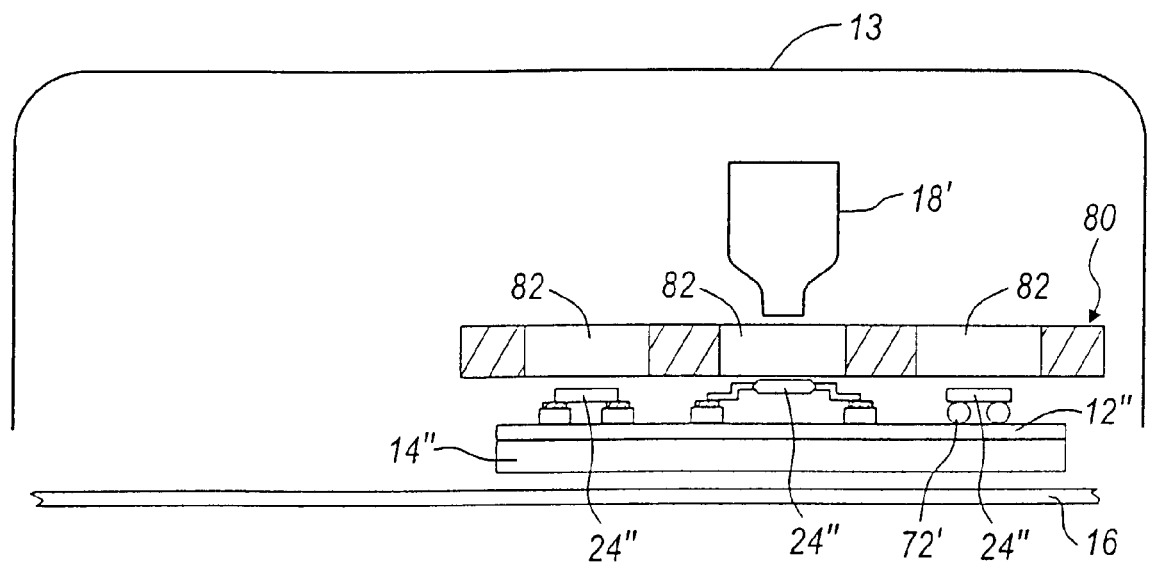
FIGS. 4a–4b is a schematic representation of a system for reflowing solder to electrically connect electronic components to a substrate using a stencil, in accordance with the present invention.
Figure 4B:
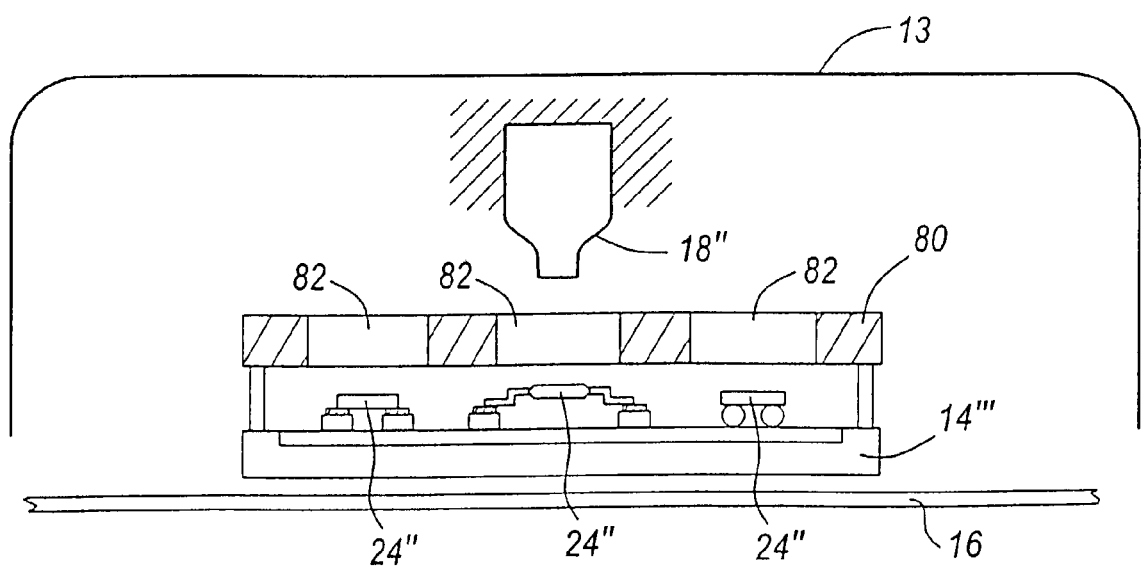

Referring now to FIGS. 4a and 4b, another embodiment of the present invention is illustrated wherein a stencil 80 is introduced between the gas nozzle 18' and the substrate 12 or 12'. The stencil 80 has a plurality of opening or apertures 82 disposed therein. The apertures 82 expose certain areas of the substrate 12" and/or components 24" to gas nozzle 18' to reflow the solder paste 72'. The stencil 80 also shields substrate 12" areas and/or components that are not to be exposed to the gas jet. In this manner solder paste is melted in the appropriate areas and potential damage caused by heating the substrate to elevated temperatures is avoided. In another embodiment as shown in FIG. 4a, the pallet 14" and stencil 80 are held stationary while the gas nozzle traverses the stencil to selectively heat the substrate areas. In another embodiment, as shown in FIG. 4b, a hot gas nozzle 18" is held stationary while pallet 14'" and stencil 80 move below the gas nozzle 18". This embodiment would require multiple stencils to heat and reflow the desired areas of the substrate and electronic components.

Figure 5:
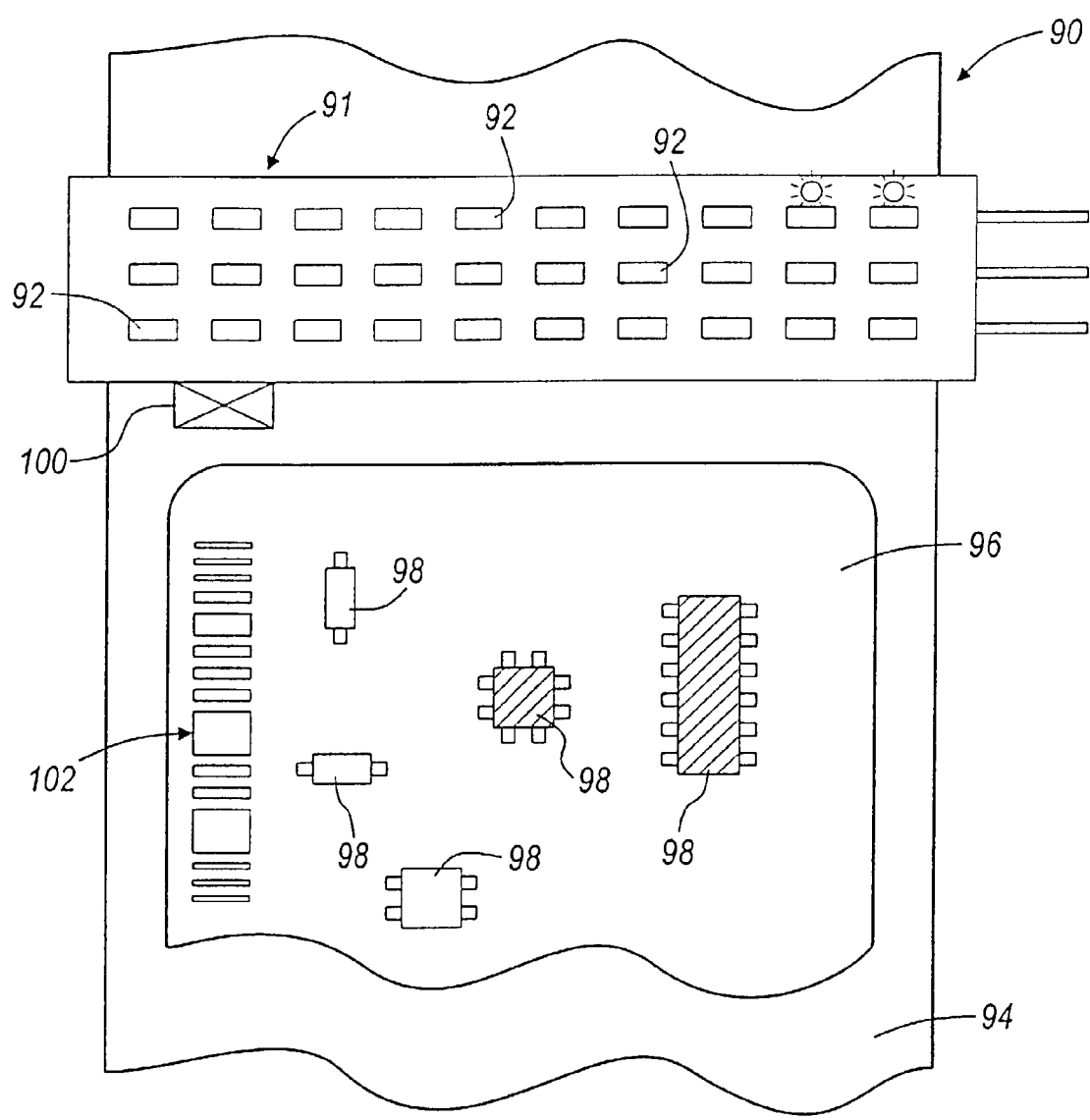
FIG. 5 is a schematic representation of a system for reflowing solder to electrically connect electronic components to a substrate using an array of hot gas nozzles, in accordance with the present invention.

In yet another embodiment of the present invention, a system 90 for reflowing solder is illustrated in FIG. 5. The present embodiment contemplates system 90, having an array of gas nozzles 92 positioned above a conveyor system 94. The array of gas nozzles 92 are computer controlled and as such may be programmed to separately actuate for a defined period of time. The gas nozzles 92 are programmed to actuate and release high temperature gas on selected areas of a populated substrate 96 to reflow the solder paste as the components 98 pass underneath the array of nozzles 91. Preferably, a downward facing camera 100 or optical scanner is used to read a bar code 102 printed on substrate 96 to identify the substrate 96 and program the actuation of the array of gas nozzles 91. Array 91 may be constructed from a silicon micromachined structure and contain silicon micromachined valves. Other selective heating techniques such as soft beam may be used wit the gas nozzle array 91. Moreover, the present invention contemplates using different gas pressures in different gas nozzles in the array 91.

Figure 6:
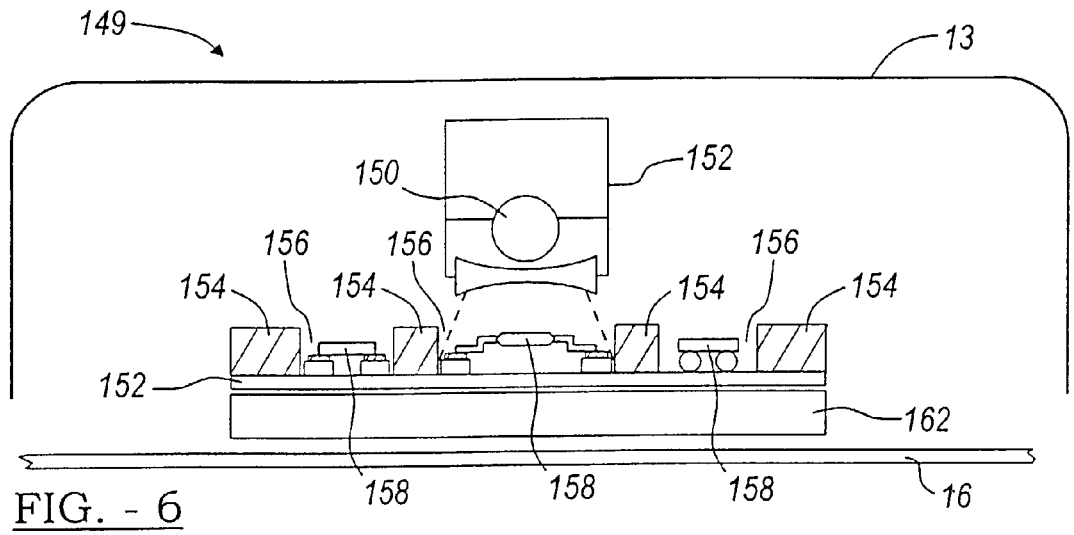
FIG. 6 is a schematic representation of a system for reflowing solder to electrically connect electronic components to a substrate using an infra red light source, in accordance with the present invention.

In still another embodiment of the present invention, as shown in FIG. 6, a system 149 for reflowing solder using an infra-red light source 150 as a supplemental heat source 152 is illustrated. In the instant embodiment a substrate 152 is covered with a protective cover 154 that is impervious to infra-red radiation. Protective cover 154 has a plurality of apertures 156 for exposing the electronic components 158 to be soldered to substrate 152. The infrared light source 156 may include a plurality of infra red devices to produce a desired heating effect. Further, a Collimating lens 160 is placed between the infra red light 150 and the populated substrate 152 to focus the light directed toward the substrate. Once the protective cover 154 is in place the pallet 162/substrate 152/cover 154 assembly is placed on conveyor 16 and transported through reflow oven 13. The temperature of the oven 13 may be set at a temperature that does not damage substrate 152. The additional heat energy required to reflow the solder paste, disposed between the electronic components 158 and the solder pads on the substrate is supplied by the infra red light source 150.

Figure 7A:
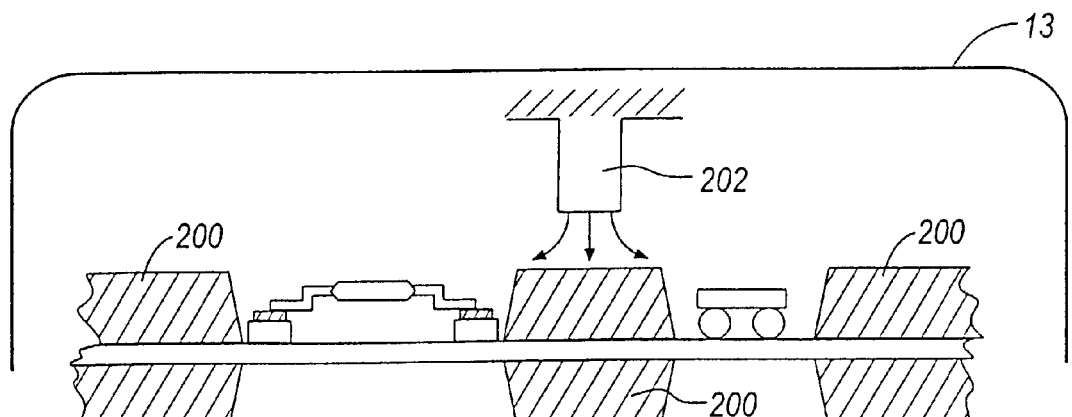
FIGS. 7a–7b is a schematic representation of a system for reflowing solder to electrically connect electronic components to a substrate using a protective cover, in accordance with the present invention.
Figure 7B:
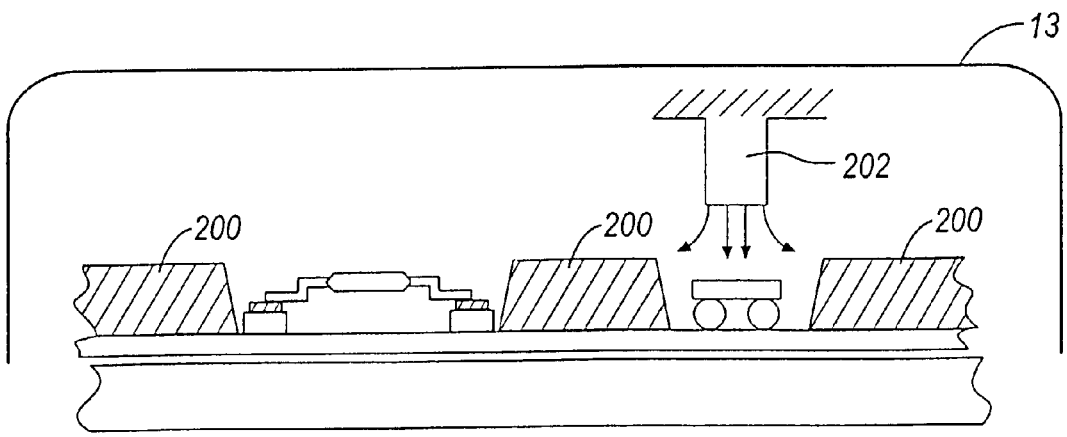

FIGS. 7a–7b illustrate a protective cover 200 for shielding portions of the substrate from hot gasses emanating from gas nozzle 202. In an embodiment of the present invention protective cover 200 is made from insulative materials such as FR4 material or aluminum or the like. This type of cover may combined with any of the previous embodiments, as appropriate.

Figure 8:
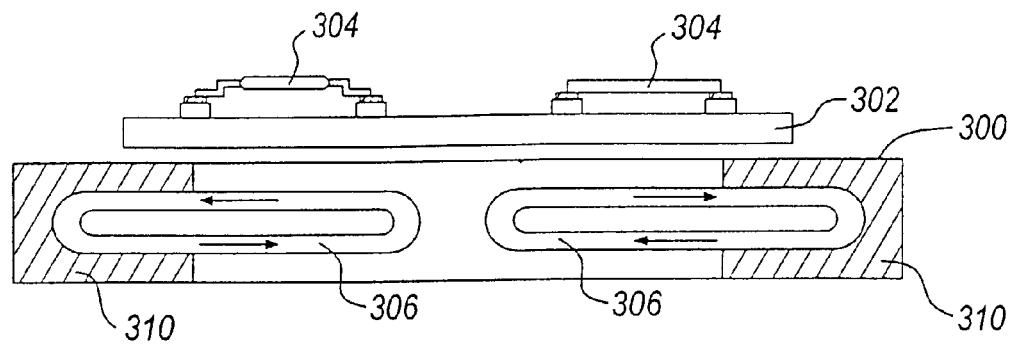
FIG. 8 is a schematic representation of a system for reflowing solder to electrically connect electronic components to a substrate using a pallet having heat pipes, in accordance with the present invention.

FIG. 8 is a cross-sectional view through a pallet 300. Pallet 300 supports a substrate 302 populated with electronic components 304. Pallet 300 includes a plurality of heat pipes 306 which draw heat away from substrate 302 to cooler regions of the pallet. Additionally, the heat pipes are in communication with phase transition regions 310 which contain phase transition material, as described previously. The heat pipes and phase transition regions 310 cooperate to cool the substrate 302 to insure the substrate is not damage by exposure to the supplement a heat source.

Figure 9A:
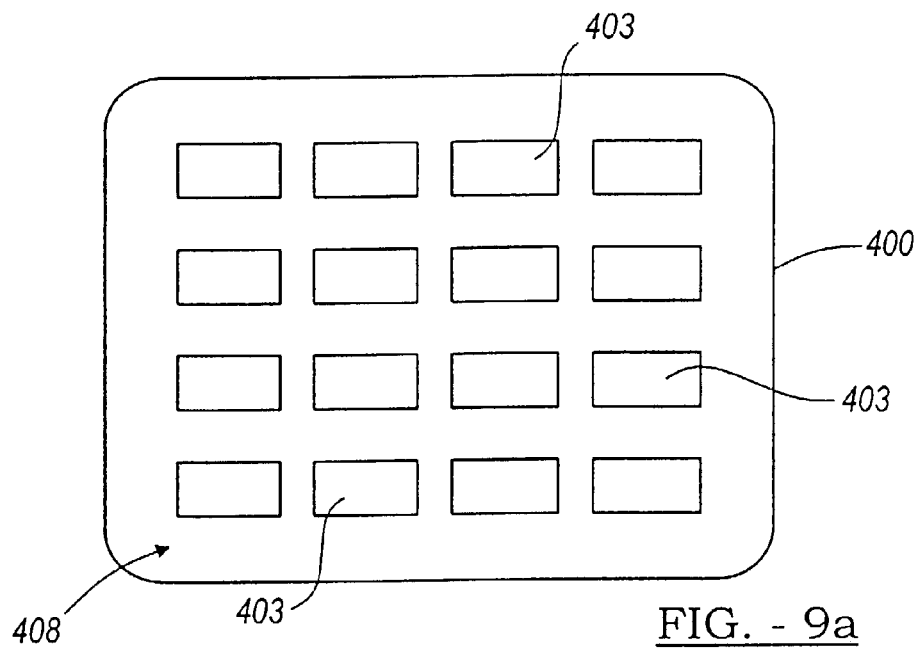
FIG. 9 is a schematic representation of a system for reflowing solder to electrically connect electronic components to a substrate using a pallet having thermoelectric coolers, in accordance with the present invention.
Figure 9B:
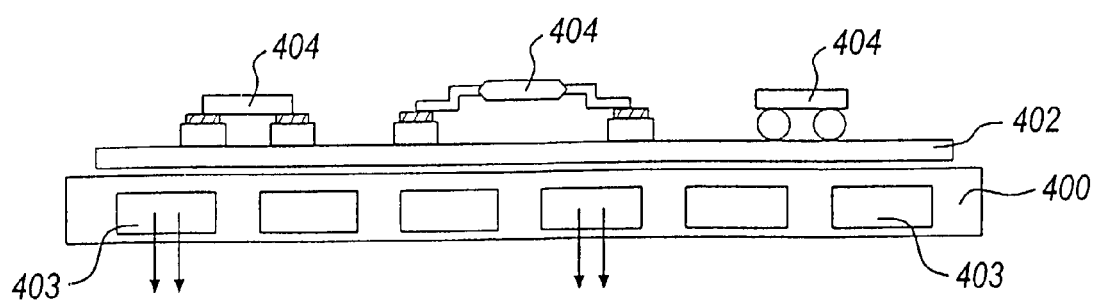

In another embodiment of the present invention, as shown in FIG. 9a–9b, a pallet 400 is provided having thermoelectric coolers 403 to absorb heat away from substrate 402. As in the previous embodiments a supplemental heat source is applied to substrate 402 populated with electronic components 404 to reflow solder disposed there between. As shown in FIG. 9a, the present invention contemplates an array 408 of thermoelectric coolers 403 disposed in pallet 400. The array 408 may be independently actuated and controlled to provide localized cooling.

Figure 10:
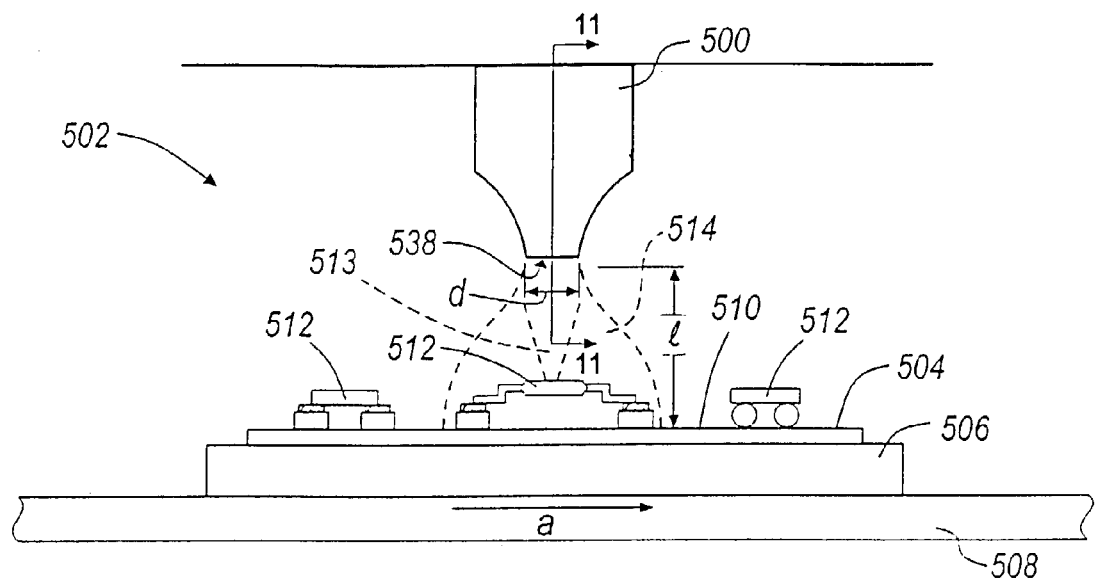
FIG. 10 is a schematic representation of a system for reflowing solder to electrically connect electronic components to a substrate using a gas nozzle having vanes that direct the gas in a transverse direction, in accordance with the present invention.

In still another embodiment of the present invention a transverse flow nozzle 500 is provided for directing hot gas transversely across the substrate, as illustrated in FIG. 10. Nozzle 500 is generally disposed within a reflow oven 502 having conventional heaters or heat sources (not shown). The heaters are located above and below the substrate. The lower heaters in the oven are maintained at 5 to 15 degrees C. lower temperature than those on the top. The nozzle may be mounted to a pivotable structure (not shown) to allow the nozzle to pivot to direct gas upstream or down stream on the substrate. In operation a substrate 504 have a plurality of circuit traces attached thereto is carried by a ridged pallet 506, such as the pallets disclosed above, into oven 502. Other pallets may be used, such as pallets made of a single material such as Glastik, or made of a composite, such as aluminum for the contacting surface and an insulator such as FR4 for the back side (bottom surface) of the pallet. The insulator would shield the heat from the bottom side, while the aluminum provides heat sinking to the pallet and keeps the substrate temperature low. As shown above the pallet would have a cavity to accommodate electronic components attached to the other side of the substrate. The substrate 504 and pallet 506 are transported through oven 502 via a conveyor belt system 508. The speed of conveyor 508 ranges from 10 inches per minute to 50 inches per minute. Typically, substrate 504 will have a plurality of circuit traces (not shown) attached to a top surface 510 of the substrate 504. A plurality of electrical components 512, such as surface mount devices are placed on top of the circuit traces and solder paste (not shown) is disposed between the surface mount devices and the circuit traces. The nozzle has a nozzle exit width d and is positioned a distance (l) from the substrate, where the ratio of l/d is less than 14. This ensures that the central cone 513 of the hot gas jet, which is about 14 jet diameters (d) long, is intact when the jet impinges on the substrate. Moreover, this ensures improved heat transfer from the jet to the substrate. The hot gas jet is preferably heated air. The substrate may be polyethylene terephthalate having a glass transition temperature of 85 degree C.

The substrate populated with the electrical components is transported through oven 502 which raises the temperature of the substrate to a predetermined level, preferably to approximately 130° C. Nozzle 500 receives hot gas, ranging in temperature from 200 to 500° C., as indicated by arrow (i). The hot gas is distributed over the width of the substrate to further heat the components 512, solder paste (not shown), and substrate 504 to approximately 250° C. In this manner the solder paste is liquefied. The configuration of the nozzle, as well as, the positioning of the nozzle with respect to the substrate, as will be described below, creates a well defined gas jet or stream 514. Gas stream 514 heats only a desired portion of the substrate leaving other portions of the substrate unheated. Thus, the present invention prevents damage to the substrate by focusing the hot gas and exposing only desired portions of the substrate to the gas.

Figure 11:
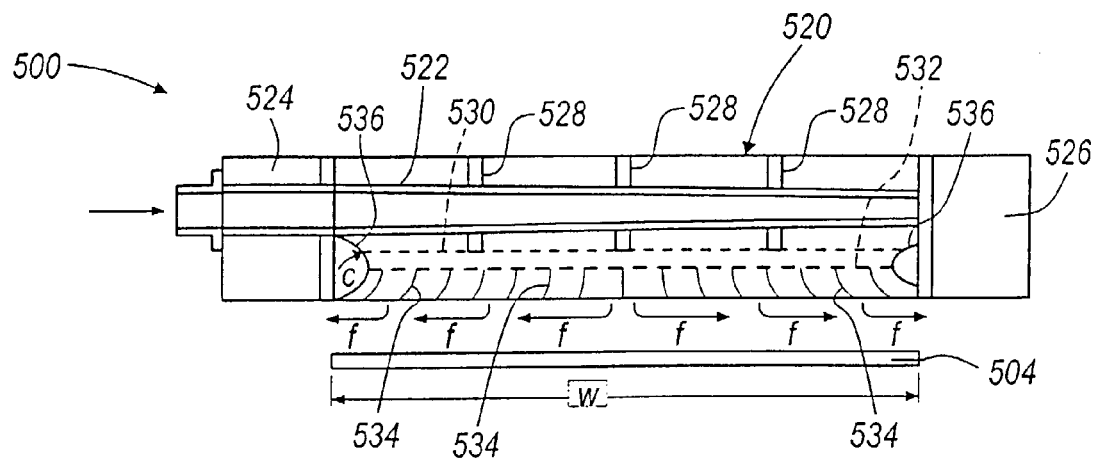
FIG. 11 is a cross-sectional view of the gas nozzle of FIG. 10, having vanes that direct the gas in a transverse direction, in accordance with the present invention.

FIG. 11 is a cross-sectional view of nozzle 500, in accordance with the present invention. Nozzle 500 includes a nozzle housing 520. Nozzle housing 520 supports a gas distribution pipe 522 at either end of pipe 522 via structural support members 524 and 526 and along the intermediate portion of pipe 522 via support brackets 528. Distribution pipe or tube 522 is tapered along its longitudinal axis to facilitate uniform distribution of the hot gas at the nozzle exit and includes a plurality of apertures from which the hot gas emanates. A pair of gratings 530 and 532 comprised of a wire mesh and/or perforated plates operate in conjunction with a series of vanes 534 to distribute the hot gas over the substrate. Vanes 534 are positioned at a progressively increasing angle with respect to the vertical, moving from the center of the nozzle to the ends of the nozzle. Furthermore, vanes may be curved to facilitate transverse flow of the gas. Transverse flow is defined herein as, flow directed predominantly perpendicular to the direction of travel of the substrate through the oven. Further, a pair of deflectors 536 having a radius r deflect air down towards the nozzle opening 538. As indicated by arrows (f), hot gas is distributed across a width w of the substrate in a transverse direction. Thus, a narrow strip of hot gas is created and impinges only along a desired portion of the substrate.

Thus, the process of reflowing the solder paste between the electronic components and the substrate as described above is controlled by balancing the temperature within the oven 502, the speed of conveyor 508, the temperature of the gas exiting nozzle 500, the gas flow rate, and the width of the exit of nozzle 500 and the distance nozzle 500 is from substrate 504. The proper balancing of these parameters, through the use of the present invention, provides reflow of the solder paste without damaging the substrate.

In a preferred embodiment of the present invention, as shown in FIG. 1, substrate 12 having a plurality of electronic components disposed thereon is placed in a reflow oven 13 having a plurality of heaters 22 for preheating substrate 12. The plurality of heaters 22 are precisely controlled to provide preheating of substrate 12 prior to exposure to supplemental heat source 18. The supplemental heat source 18 may be a hot gas nozzle that provides a flow of hot gas over the electronic components 24 positioned on substrate 12 or any other heat energy source to reflow solder paste 26 thereon. In the present embodiment, solder paste 26 is of the lead-free variety having a melting temperature in the range of approximately 217°–220° C.

Figure 12:
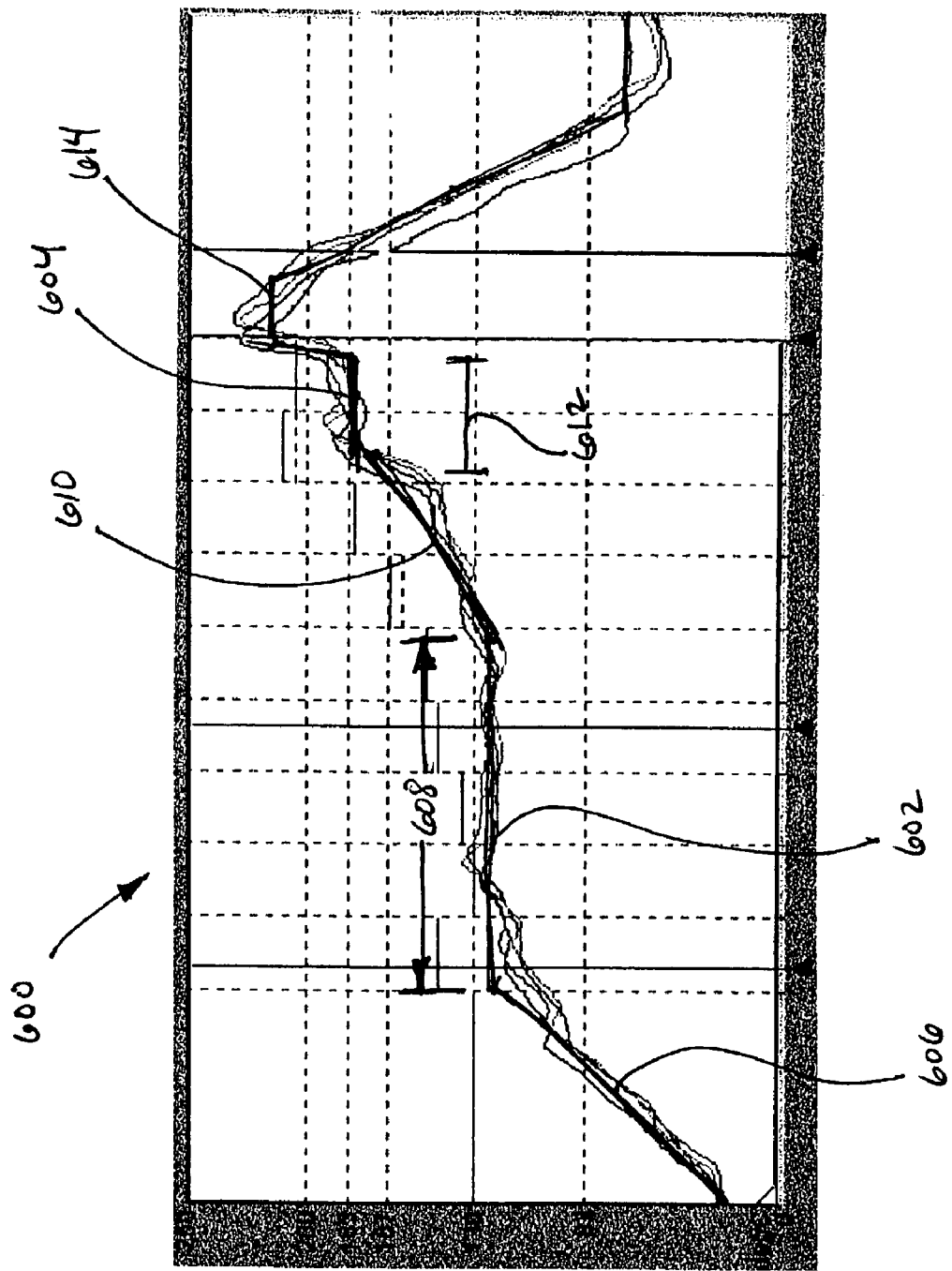
FIG. 12 is a graph of temperature of a substrate over time in a reflow oven, in accordance with the present invention.

The present invention contemplates a preferred oven 13 temperature profile, as shown in FIG. 12. Specifically, FIG. 12 is a graph of temperature of the substrate (on the vertical axis) over time (on the horizontal axis) in the reflow oven. Oven temperature profile is created by the plurality of heaters 22 as well as supplemental heat source 18 to provide an overall oven temperature profile 600. Temperature profile 600, for example, created by the plurality of an oven heaters 22 provides at least two heating levels 602, 604 for gradually increasing the heat exposure to and temperature of substrate 12. For example, the first heating level 602 is reached by controlling a portion of the oven heaters 22 to increase the temperature of substrate 12 at a rate of not more than 2° C./second over a first predetermined transitional period 606. For example, the first predetermined transitional period is between 60 and 120 seconds. The first heating level 602 is reached when the temperature of substrate 12 is approximately 130°–160° C. The oven heaters 22 are controlled to hold the temperature of substrate 12 at first heating level 602 for a first heating level predefined period 608. For example, the first heating level predefined period is between 120 and 240 seconds. After the first predefined heating level period 608 has elapsed, the oven heaters 608 are controlled to provide an increase in temperature of substrate 12 at a rate of not more than 2° C. per second. After a second predetermined transitional period of time 610, substrate 12 reaches the second heat level 604 that is approximately in the range of 190°–230° C. For example, the second predetermined transitional period is between 30 and 120 seconds. Again, oven heaters 22 are controlled to hold the substrate temperature at the second heating level for a second heating level predefined period of time 612. For example, the second heating level predefined period is between 60 and 180 seconds. After the second heating level period of time 612 has elapsed, the supplemental heat source 18 provides a rapid increase in the temperature of substrate 12 to a peak temperature 614 of between 230° and 280° C. Further, supplemental heat source 18 is controlled such that the duration at which substrate 12 is held at a temperature above 225° C. is not more than 15 seconds.

A preferred system 10 set-up includes a conveyor, transporting the substrate 12 at a speed of 40 inches per second. The nozzle temperature of supplemental heat source 18 preferably is 300° C. System 10 does not in all embodiments require a pallet 14 to support and transport substrate 12 on conveyor 16 nor is a pallet required in all embodiments to dissipate heat from substrate 12. A cover is also not needed to protect various portions of the electronic assembly. The preferred embodiment of system 10 utilizes oven temperature profile 600 to reflow solder without damaging substrate 12, rather than using a cover or a pallet to control heat exposure to and absorption in substrate 12.

The preferred embodiment of the present invention is uniquely configured for reflowing lead-free solder which has a melting temperature between 217° and 2200° C. The temperature profile 600 provided by oven 13, heaters 22 and supplemental heat source 18 decreases or eliminates the likelihood of damage to substrate 12 while providing sufficient heat energy to reflow the lead free solder.

As any person skilled in the art of system and method for reflowing solder to electrically connect electronic components to a substrate having a low softening temperature will recognize from the previous detailed description and from the figures and claims, modifications and changes can be made to the preferred embodiments of the invention without departing from the scope of this invention defined in the following claims.

We claim:

1. A method far reflowing solder to interconnect a plurality of electronic components to a substrate, the method comprising:
   inserting the substrate into an oven;
   preheating the substrate and the plurality of electronic components disposed thereon to a first heating level, wherein the first heating level is maintained for a duration of between 120 and 290 seconds;
   preheating the substrate and the plurality of electronic components disposed thereon further to a second heating level, wherein the second heating level is maintained for a duration of between 60 and 180 seconds;
   heating the substrate to a peak healing level to reflow the solder using a supplemental heat source positioned within the oven; and
   positioning the supplemental heat a distance e above the substrate and providing a supplemental heat source exit having a dimension d and wherein a ratio e/d is less than or equal to fourteen.

2. The method of claim 1 further comprising creating a stream of hot gas using the supplemental heat source, wherein the gas flows transversely across the substrate.

3. The method of claim 2 wherein inserting the substrate into an oven further comprises transporting the substrate through the oven using a conveyor.

4. The method of claim 3 wherein transporting the substrate further comprises moving the substrate through the oven at a speed of between 10 to 50 inches per minute.

5. The method of claim 3 further comprising limiting heat absorption by the substrate to prevent damaging the substrate by adjusting a speed of the conveyor, a distance the supplemental heat source is from the substrate, and a temperature of the gas.

6. The method of claim 1 further comprising providing a gas having a temperature range between 200 to 500 degrees Celsius.

7. A method for reflowing solder to interconnect a plurality of electronic components to a substrate, the method comprising:

inserting the substrate into an oven;

preheating the substrate and the plurality of electronic components disposed thereon to a first heating level, wherein the first heating level is maintained for a duration of between 120 and 290 seconds;

preheating the substrate and the plurality of electronic components disposed thereon further to a second heating level;

heating the substrate to a peak heating level to reflow the solder using a supplemental heat source positioned within the oven;

positioning the supplemental heat a distance e above the substrate and providing a supplemental heat source exit having a dimension d and wherein a ratio e/d is less than or equal to fourteen; and wherein preheating the substrate further comprises heating the substrate to a second heating level wherein the second heating level has a duration of between 60 to 180 seconds.

8. The method of claim 1 wherein the first heating level is between 130°–160°.

9. The method of claim 7 wherein the second heating level is 190°–230° C.

10. The method of claim 1 wherein the peak healing level is between 230°–280° C.

* * * * *

UNITED STATES PATENT AND TRADEMARK OFFICE
CERTIFICATE OF CORRECTION

| | | |
|---|---|---|
| PATENT NO. | : 7,026,582 B2 | Page 1 of 1 |
| APPLICATION NO. | : 10/431258 | |
| DATED | : April 11, 2006 | |
| INVENTOR(S) | : Lakhi N. Goenka et al. | |

It is certified that error appears in the above-identified patent and that said Letters Patent is hereby corrected as shown below:

Column 8, in claim 1, line 1, after "A method" delete "far" and substitute --for--.

Column 8, in claim 1, line 16, after "heat a distance" delete "e" and substitute --1--.

Column 8, in claim 1, line 18, after "wherein a ratio" delete "e/d" and substitute --l/d--.

Column 9, in claim 7, line 15, after "heat a distance" delete "e" and substitute --l--.

Columns 9-10, in claim 7, line 17, after "wherein a ratio" delete "e/d" and substitute --l/d-- in its place.

Signed and Sealed this

Twenty-first Day of November, 2006

JON W. DUDAS
*Director of the United States Patent and Trademark Office*